(12) United States Patent
Park et al.

(10) Patent No.: US 12,550,718 B2
(45) Date of Patent: Feb. 10, 2026

(54) SEMICONDUCTOR DEVICES HAVING IMPROVED ELECTRICAL INTERCONNECT STRUCTURES

(71) Applicant: Samsung Electronics Co., Ltd., Suwon-si (KR)

(72) Inventors: Panjae Park, Seoul (KR); Subin Choi, Suwon-si (KR); Chulhong Park, Seongnam-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 505 days.

(21) Appl. No.: 17/838,551

(22) Filed: Jun. 13, 2022

(65) Prior Publication Data

US 2023/0094036 A1 Mar. 30, 2023

(30) Foreign Application Priority Data

Sep. 27, 2021 (KR) .................. 10-2021-0127089

(51) Int. Cl.
*H01L 23/528* (2006.01)
*H10D 30/62* (2025.01)
(Continued)

(52) U.S. Cl.
CPC ...... *H01L 23/5283* (2013.01); *H01L 23/5286* (2013.01); *H10D 30/6211* (2025.01);
(Continued)

(58) Field of Classification Search
CPC ............ H01L 23/5283; H01L 23/5286; H01L 29/0665; H01L 29/41733; H01L 29/41791;
(Continued)

(56) References Cited

U.S. PATENT DOCUMENTS 8,716,126 B2 5/2014 Werner et al.
9,583,438 B2 2/2017 Liaw et al.
(Continued)

FOREIGN PATENT DOCUMENTS

CN 113871450 A * 12/2021 ..... H01L 21/823821
KR 20180101698 A 9/2018
WO WO-2014097524 A1 * 6/2014 ......... H01L 23/4824

*Primary Examiner* — Ratisha Mehta
*Assistant Examiner* — Timothy Edward Duren
(74) *Attorney, Agent, or Firm* — Wolf, Greenfield & Sacks, P.C.

(57) ABSTRACT

A semiconductor device includes an active region extending on a substrate in a first direction, a gate electrode intersecting the active region and extending in a second direction, perpendicular to the first direction, a contact structure disposed on the active region on one side of the gate electrode and extending in the second direction, and a first via disposed on the contact structure to be connected to the contact structure and has a shape in which a length in the second direction is greater than a length in the first direction. A plurality of first metal interconnections are provided, which extend in the first direction on the first via, and are connected to the first via. A second via is provided, which is disposed on the plurality of first metal interconnections to be connected to the plurality of first metal interconnections and has a shape in which a length in the second direction is greater than a length in the first direction.

26 Claims, 24 Drawing Sheets

(51) Int. Cl.
*H10D 30/67* (2025.01)
*H10D 62/10* (2025.01)

(52) U.S. Cl.
CPC ..... *H10D 30/6219* (2025.01); *H10D 30/6729* (2025.01); *H10D 30/6735* (2025.01); *H10D 30/6757* (2025.01); *H10D 62/118* (2025.01)

(58) Field of Classification Search
CPC ........... H01L 29/42392; H01L 29/7851; H01L 29/78696
See application file for complete search history.

(56) References Cited

U.S. PATENT DOCUMENTS

| | | |
|---|---|---|
| 10,410,965 B2 | 9/2019 | Wee et al. |
| 2007/0152338 A1 | 7/2007 | Kim |
| 2014/0159158 A1 | 6/2014 | Kim et al. |
| 2017/0110405 A1* | 4/2017 | Peng .................. H01L 23/5286 |
| 2018/0253522 A1 | 9/2018 | Hsieh et al. |
| 2018/0254287 A1 | 9/2018 | Seo et al. |
| 2019/0206893 A1* | 7/2019 | Liaw ................ H01L 21/76895 |
| 2021/0098313 A1 | 4/2021 | Liaw |
| 2021/0098369 A1 | 4/2021 | Kuang et al. |
| 2021/0272901 A1* | 9/2021 | Tsai .................... H10D 84/038 |
| 2022/0157804 A1* | 5/2022 | Wang ................ H10D 84/0186 |
| 2022/0262944 A1* | 8/2022 | Jeong ................ H10D 62/116 |

* cited by examiner

SEMICONDUCTOR DEVICES HAVING IMPROVED ELECTRICAL INTERCONNECT STRUCTURES

REFERENCE TO PRIORITY APPLICATION

This application claims priority to Korean Patent Application No. 10-2021-0127089, filed Sep. 27, 2021, the disclosure of which is hereby incorporated herein by reference.

BACKGROUND

The present disclosure relates to integrated circuit devices and, more particularly, to highly integrated circuit devices having multiple layers of interconnects therein.

With increasing demand for high performance, high speed, and/or multifunctionality in a semiconductor device, the integration density of a semiconductor device has increased. As the integration density of a semiconductor devices has increased, research has been conducted to design layouts, which include more efficient routing of interconnections for connecting semiconductor devices and to reduce resistance and capacitance of the interconnections.

SUMMARY

Example embodiments provide a semiconductor device having improved electrical characteristics, higher integration, and reliability.

According to an example embodiment, a semiconductor device includes: an active region extending lengthwise on a substrate in a first direction, a gate electrode intersecting the active region and extending lengthwise in a second direction, perpendicular to the first direction, and a contact structure disposed on the active region on one side of the gate electrode and extending lengthwise in the second direction. A first via is also provided, which is disposed on the contact structure to be connected to the contact structure and has a shape in which a length in the second direction is greater than a length in the first direction. A plurality of first metal interconnections are provided, which extend in the first direction on the first via and are connected to the first via. A second via is provided, which is disposed on the plurality of first metal interconnections and is electrically connected to the plurality of first metal interconnections, and has a shape in which a length in the second direction is greater than a direction in the first direction.

According to an example embodiment, a semiconductor device includes: a channel region and a first source/drain region on a substrate, a gate electrode overlapping the channel region on the substrate, a first contact structure connected to the first source/drain region, and a plurality of first metal interconnections, which are disposed on the first contact structure, extend in a first direction (and parallel to an upper surface of the substrate), and are spaced apart from each other. A first via is provided in contact with the first contact structure and the plurality of first metal interconnections between the first contact structure and the plurality of first metal interconnections. A second via is provided in contact with the plurality of first metal interconnections, and on the plurality of first metal interconnections.

According to an example embodiment, a semiconductor device includes a device region including active regions, extending on a substrate in a first direction, and gate electrodes extending in a second direction, perpendicular to the first direction. A first power supply line and a second power supply line are provided, which are disposed on the device region to extend in the first direction, and are configured to supply different potentials to the device region. A plurality of interconnection patterns are provided, which are disposed side-by-side on substantially the same level as the first power supply line and the second power supply line and extend in the first direction. A first via is provided, which is disposed below the plurality of interconnection patterns to electrically connect the plurality of interconnection patterns to each other and extends sufficiently in the second direction to thereby have a length greater than or equal to a minimum separation distance between the plurality of interconnection patterns. A second via is provided, which is disposed on the plurality of interconnection patterns to electrically connect the plurality of interconnection patterns to each other and extends sufficiently in the second direction to thereby have a length greater than or equal to the minimum separation distance between the plurality of interconnection patterns.

BRIEF DESCRIPTION OF DRAWINGS

The above and other aspects, features, and advantages of the present disclosure will be more clearly understood from the following detailed description, taken in conjunction with the accompanying drawings.

DETAILED DESCRIPTION

Hereinafter, example embodiments will be described with reference to the accompanying drawings.

Figure 1A:
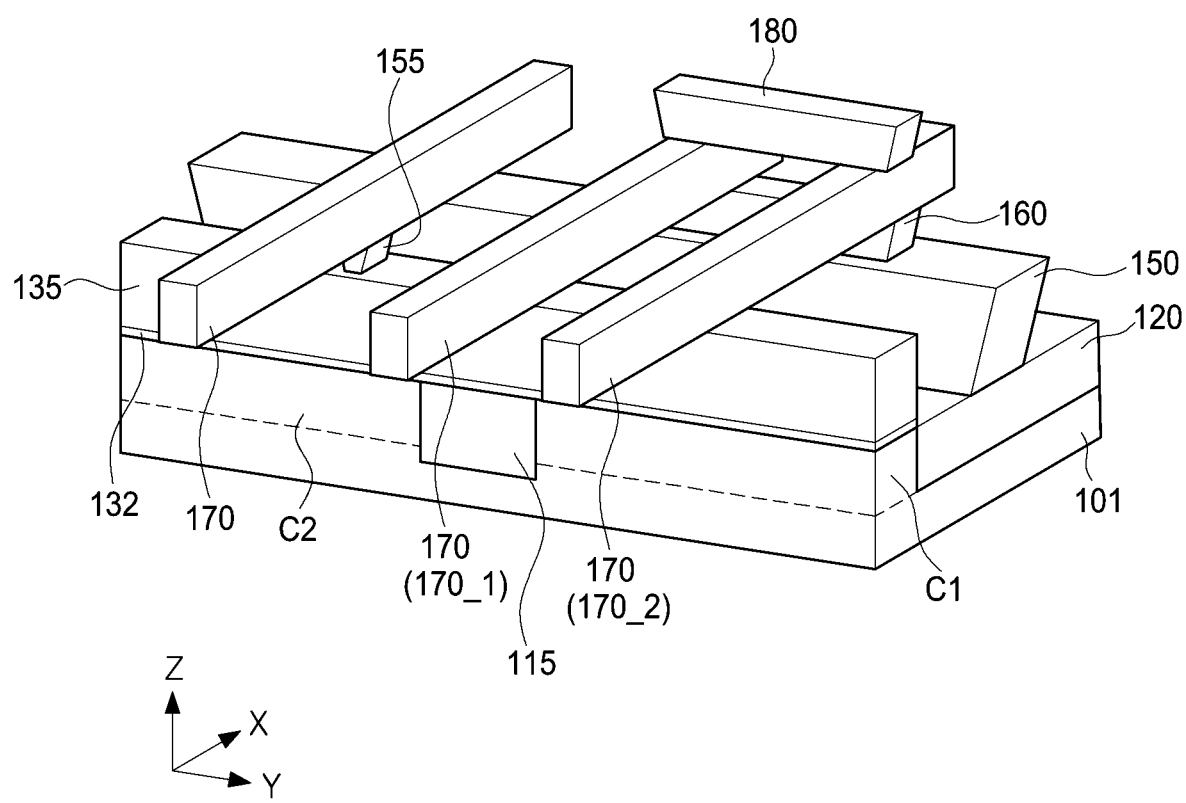
FIG. 1A is a schematic perspective view of a semiconductor device according to example embodiment.
Figure 1B:
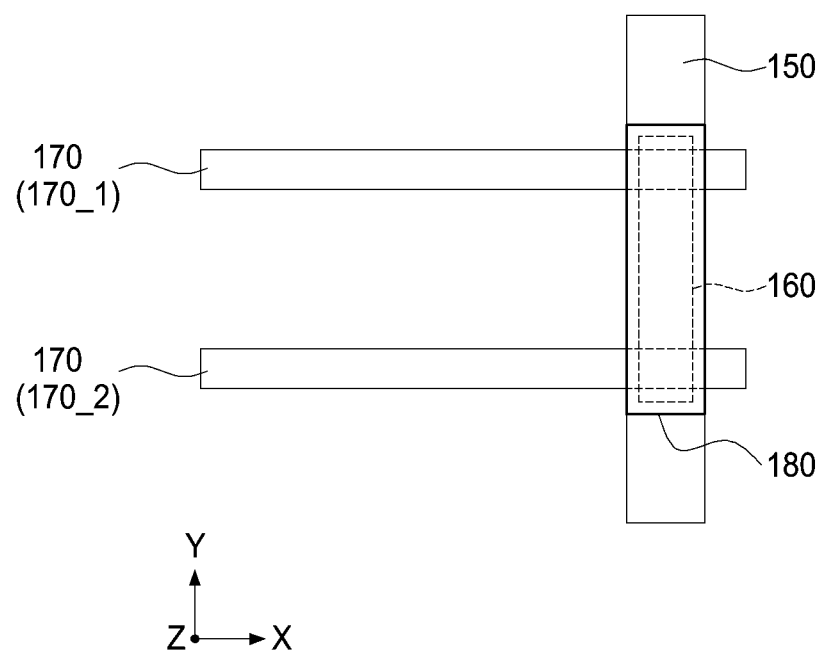
FIG. 1B is a schematic plan view illustrating an interconnection line structure according to example embodiments.

FIG. 1A is a schematic perspective view of a semiconductor device according to example embodiments, whereas FIG. 1B is a schematic plan view illustrating an interconnection line structure according to example embodiments. Referring to FIGS. 1A and 1B, a semiconductor device 100A may include a substrate 101, a device isolation layer 115 in the substrate 101, a gate electrode 135 on the substrate 101, source/drain regions 120 disposed on the substrate 101 on at least one side of the gate electrode 135, a contact structure 150 on the source/drain regions 120, a first via 160 on the contact structure 150, a plurality of first metal interconnections 170 on the first via 160, and a second via 180 on the plurality of first metal interconnections 170.

The substrate 101 may include a semiconductor material, for example, a group IV semiconductor, a group III-V compound semiconductor, or a group II-VI compound semiconductor. For example, the group IV semiconductor may include silicon (Si), germanium (Ge), or silicon germanium (SiGe). The substrate 101 may be provided as a bulk wafer, an epitaxial layer, a silicon-on-insulator (SOI) layer, a semiconductor-on-insulator layer, or the like. In the substrate 101, an active region may be defined by the device isolation layer 115 and may extend in a first direction, for example, an X-direction. the active region may have a structure protruding from the substrate 101.

The device isolation layer 115 may be formed by, for example, a shallow trench isolation (STI) process. The device isolation layer 115 may be disposed to extend in the X direction within the substrate 101. The device isolation layer 115 may be formed of an insulating material and may include, for example, an oxide, a nitride, or a combination thereof.

The source/drain regions 120 may be disposed on the active region on at least one side of the gate electrode 135. The source/drain regions 120 may be provided as a source region or a drain region of a transistor. The source/drain regions 120 may be formed of a semiconductor material. For example, the source/drain regions 120 may include at least one of silicon (Si), silicon germanium (SiGe), silicon arsenide (SiAs), silicon phosphide (SiP), and silicon carbide (SiC). For example, the source/drain regions 120 may include N-type doped silicon (Si) and/or P-type doped silicon germanium (SiGe). In example embodiments, the source/drain regions 120 may include a plurality of regions including elements having different concentrations and/or doping elements.

The gate electrode 135 may be disposed to extend in a second direction, for example, a Y-direction while intersecting the active region. Channel regions C1 and C2 of the transistor may be formed in the active region intersecting the gate electrode 135. The gate electrode 135 may be disposed to overlap the channel regions C1 and C2. The channel regions C1 and C2 may be separated from each other in the Y-direction by the device isolation layer 115. The channel regions C1 and C2 may be in contact with the source/drain regions 120. The term "channel region" may refer to a region including a depletion region of a transistor. A gate dielectric layer 132, including an insulating material, may be disposed between the gate electrode 135 and the channel regions C1 and C2. The gate electrode 135 may include a conductive material, for example, a metal nitride such as titanium nitride (TiN), tantalum nitride (TaN), or tungsten nitride (WN), and/or a metal such as aluminum (Al), tungsten (W), or molybdenum (Mo), or a semiconductor material such as doped polysilicon.

The contact structure 150 may be connected to the source/drain regions 120 to apply an electrical signal to the source/drain regions 120 or to supply power to the source/drain regions 120. The contact structure 150 may extend from an upper portion to a lower portion to be in contact with the source/drain regions 120. In the drawings, the contact structure 150 is illustrated as extending along upper surfaces of the source/drain regions 120. However, according to some embodiment, the contact structure 150 may be disposed to recess a portion of the source/drain regions 120. The contact structure 150 may be disposed to be elongated in the Y-direction, for example, may have a line shape or a bar shape in which a length in the Y-direction is greater than a length in the X-direction. The contact structure 150 may have an inclined side surface of which a lower portion is narrower than an upper portion depending on an aspect ratio, but example embodiments are not limited thereto. The contact structure 150 may include at least one of, for example, titanium nitride (TiN), tantalum nitride (TaN), tungsten nitride (WN), tungsten carbon nitride (WCN), titanium (Ti), tantalum (Ta), tungsten (W), copper (Cu), aluminum (Al), cobalt (Co), ruthenium (Ru), and molybdenum (Mo). A metal-semiconductor compound layer, such as metal silicide, metal germanide, or metal silicide-germanide, may be further disposed between the contact structure 150 and the source/drain regions 120.

As illustrated in FIG. 1A, a gate contact structure 155 may be further disposed on the gate electrode 135. The gate contact structure 155 may apply an electrical signal to the gate electrode 135. The gate contact structure 155 may be at least one of, for example, titanium nitride (TiN), tantalum nitride (TaN), tungsten nitride (WN), tungsten carbon nitride (WCN), titanium (Ti), tantalum (Ta), tungsten (W), copper (Cu), aluminum (Al), cobalt (Co), ruthenium (Ru), and molybdenum (Mo). In example embodiments, the gate contact structure 155 may have a form in which at least two contacts are stacked.

The first via 160 may be disposed on the contact structure 150 to be connected to the contact structure 150. The first via 160 may be disposed below the plurality of first metal interconnections 170, and the plurality of first metal interconnections 170 may be connected to the single first via 160, respectively. The first via 160 may be disposed between the contact structure 150 and the plurality of first metal interconnections 170. The first vias 160 may be elongated in the Y-direction to provide a plurality of electrical signal paths from the contact structure 150 to the plurality of first metal interconnections 170. For example, the first via 160 may have a line shape or a bar shape in which a length in the Y-direction is greater than a length in the X-direction. The length of the first via 160 in the Y-direction may be greater than a separation distance or a pitch between adjacent the first line pattern 170_1 and the second line pattern 170_2 in the Y-direction. The first via 160 may be disposed to intersect the plurality of first metal interconnections 170. An upper surface of the first via 160 may include a first portion in contact with the first line pattern 170_1 and a second portion in contact with the second line pattern 170_2. A plurality of electrical signal paths may be provided from the contact structure 150 to the first line pattern 170_1 and the second line pattern 170_2 through the first portion and the second portion. The first via 160 may have an inclined side surface of which a lower portion is narrower than an upper portion, but example embodiments are not limited thereto. The first via 160 may include at least one of, for example, titanium nitride (TiN), tantalum nitride (TaN), tungsten nitride (WN), tungsten carbon nitride (WCN), titanium (Ti), tantalum (Ta), tungsten (W), copper (Cu), aluminum (Al), cobalt (Co), ruthenium (Ru), and molybdenum (Mo).

The plurality of first metal interconnections 170 may have a line shape or a bar shape extending in the X-direction. The plurality of first metal interconnections 170 may be disposed on the first via 160 to be connected to the first via 160. The plurality of first metal interconnections 170 may be electrically connected to the single contact structure 150 through the first via 160, and may be electrically connected to each other through the second via 180. The plurality of first metal interconnections 170 may include a pair of first metal interconnections 170 disposed to be adjacent to each other and to be parallel to each other, and the pair of first metal interconnections 170 may include a first line pattern 170_1 and a second line pattern 170_2. The pair of first metal interconnections 170 may be spaced apart from each other. The first line pattern 170_1 and the second line pattern 170_2 may include portions opposing each other in the Y-direction. Since the plurality of first metal interconnections 170 provide a plurality of electrical signal paths from the contact structure 150, electrical resistance in a vertical direction may be further decreased than when the single contact structure 150 and the single metal interconnection 170 are electrically connected to each other. The number of the plurality of first metal interconnections 170, electrically connected to the single contact structure 150, is not limited to that illustrated in the drawings, and may be greater than the number illustrated in the drawings. The plurality of first metal interconnections 170 may include at least one of, for example, titanium nitride (TiN), tantalum nitride (TaN), tungsten nitride (WN), tungsten carbon nitride (WCN), titanium (Ti), tantalum (Ta), tungsten (W), copper (Cu), aluminum (Al), cobalt (Co), ruthenium (Ru), and molybdenum (Mo).

The second via 180 may be disposed on the plurality of first metal interconnections 170 to be connected to the plurality of first metal interconnections 170. The second via 180 may have a line shape or a bar shape elongated in the Y-direction. A length of the second via 180 in the Y-direction may be greater than a length of the second via 180 in the X-direction. The second via 180 may be disposed to intersect the plurality of first metal interconnections 170. A length of the second via 180 in the Y-direction may be greater than a separation distance or a pitch between adjacent the first line pattern 170_1 and the second line pattern 170_2 in the Y-direction. The second via 180 may serve to electrically connect the plurality of first metal interconnections 170, which are electrically connected to the first via 160, to each other, and may cross the plurality of first metal interconnections 170, as shown. In this case, the semiconductor device 100 may or may not include an upper interconnection (for example, the second metal interconnection 190) for electrically connecting the plurality of first metal interconnections 170 to each other. When the semiconductor device 100 does not include the upper interconnection, an arrangement space of interconnections on a level, on which the upper interconnection is disposed, may be secured in the semiconductor device 100 and parasitic capacitance generated by the upper interconnection may be decreased. Moreover, because the plurality of first metal interconnections 170 are connected through the first via 160 in an underlying portion and connected through the second via 180 in an overlying portion, electrical resistance may be further decreased. The second via 180 may have an inclined side surface of which a lower portion is narrower than an upper portion, but example embodiments are not limited thereto. The second via 180 may include at least one of, for example, titanium nitride (TiN), tantalum nitride (TaN), tungsten nitride (WN), tungsten carbon nitride (WCN), titanium (Ti), tantalum (Ta), tungsten (W), copper (Cu), aluminum (Al), cobalt (Co), ruthenium (Ru), and molybdenum (Mo).

Figure 2A:
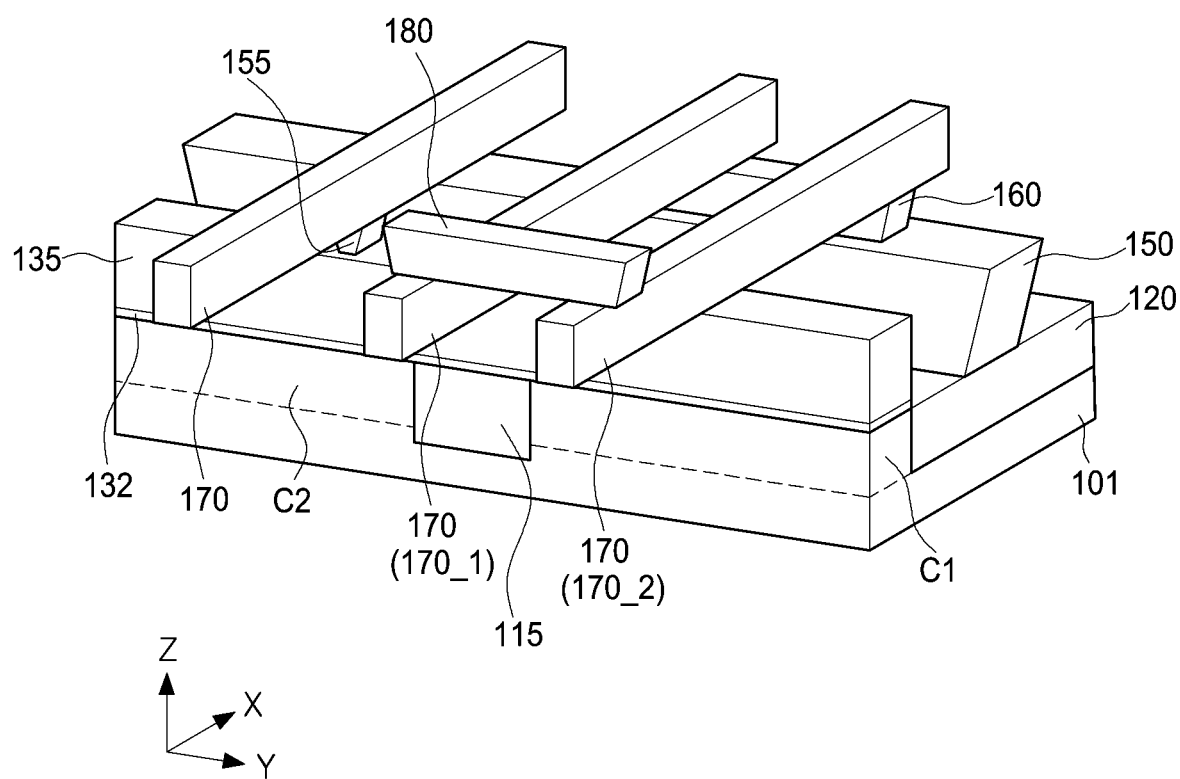
FIG. 2A is a schematic perspective view of a semiconductor device according to example embodiments.
Figure 2B:
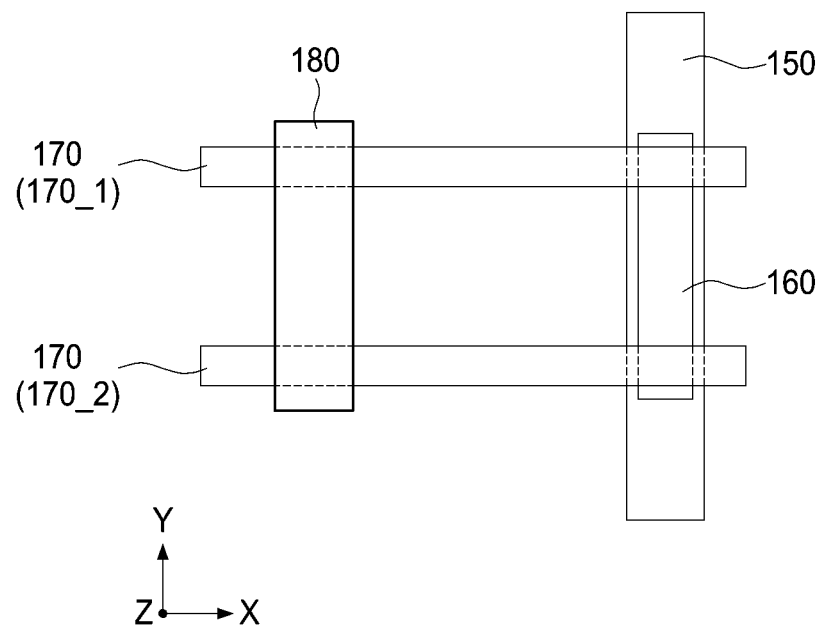
FIG. 2B is a schematic plan view illustrating an interconnection line structure of a semiconductor device according to example embodiments.

FIG. 2A is a schematic perspective view of a semiconductor device according to example embodiments, whereas FIG. 2B is a schematic plan view illustrating an interconnection line structure of a semiconductor device according to example embodiments. Referring now to FIGS. 2A and 2B, in a semiconductor device 100B, a first via 160, a plurality of first metal interconnections 170, and a second via 180 may be disposed in a mesh type or a grid pattern in a plan view. For example, the second via 180 may be disposed so as not to overlap the first via 160 in a vertical direction, for example, a Z-direction, and may be disposed to be shifted from the first via 160 in a plan view, relative to its different location illustrated by FIGS. 1A-1B.

Figure 3A:
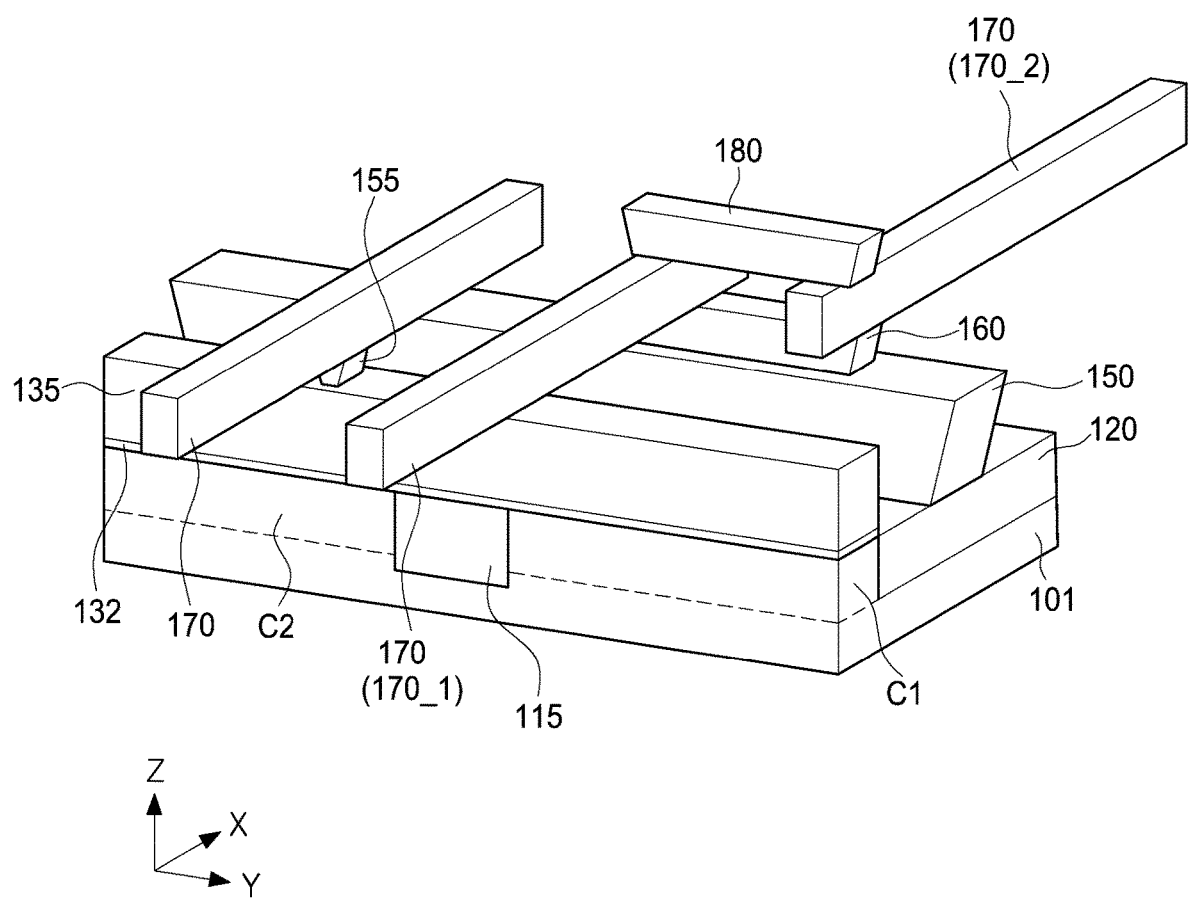
FIG. 3A is a schematic perspective view of a semiconductor device according to example embodiments.
Figure 3B:
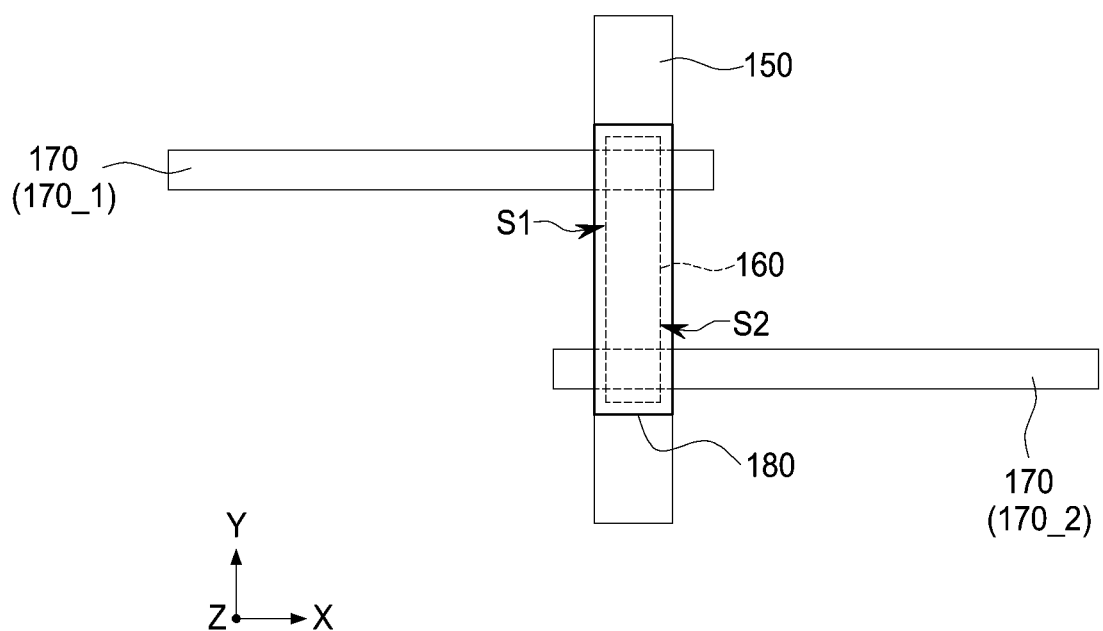
FIG. 3B is a schematic plan view illustrating an interconnection line structure of a semiconductor device according to example embodiments.

FIG. 3A is a schematic perspective view of a semiconductor device according to example embodiments, whereas FIG. 3B is a schematic plan view illustrating an interconnection line structure of a semiconductor device according to example embodiments. Referring now to FIGS. 3A and 3B, in a semiconductor device 100C, a first via 160 may have a first side surface 81 and a second side surface 82 opposing each other in an X-direction, a first line pattern 170_1 may be in contact with an upper surface of the first via 160 and may extend on the first side surface 81 of the first via 160, and a second line pattern 170_2 may be in contact with an upper surface of the first via 160 and may extend on the second side surface 82 of the first via 160. For example, one end portion of the first line pattern 170_1 in the X-direction may be disposed to be adjacent to the second side surface 82 of the first via 160, and one end portion of the second line pattern 170_2 in the X-direction may be disposed to be adjacent to the first side surface 81 of the first via 160. The first line pattern 170_1 and the second line pattern 170_2 may extend parallel to each other. For example, the first line pattern 170_1 and the second line pattern 170_2 may extend to be longer in opposing directions with respect to the first via 160.

Figure 4A:
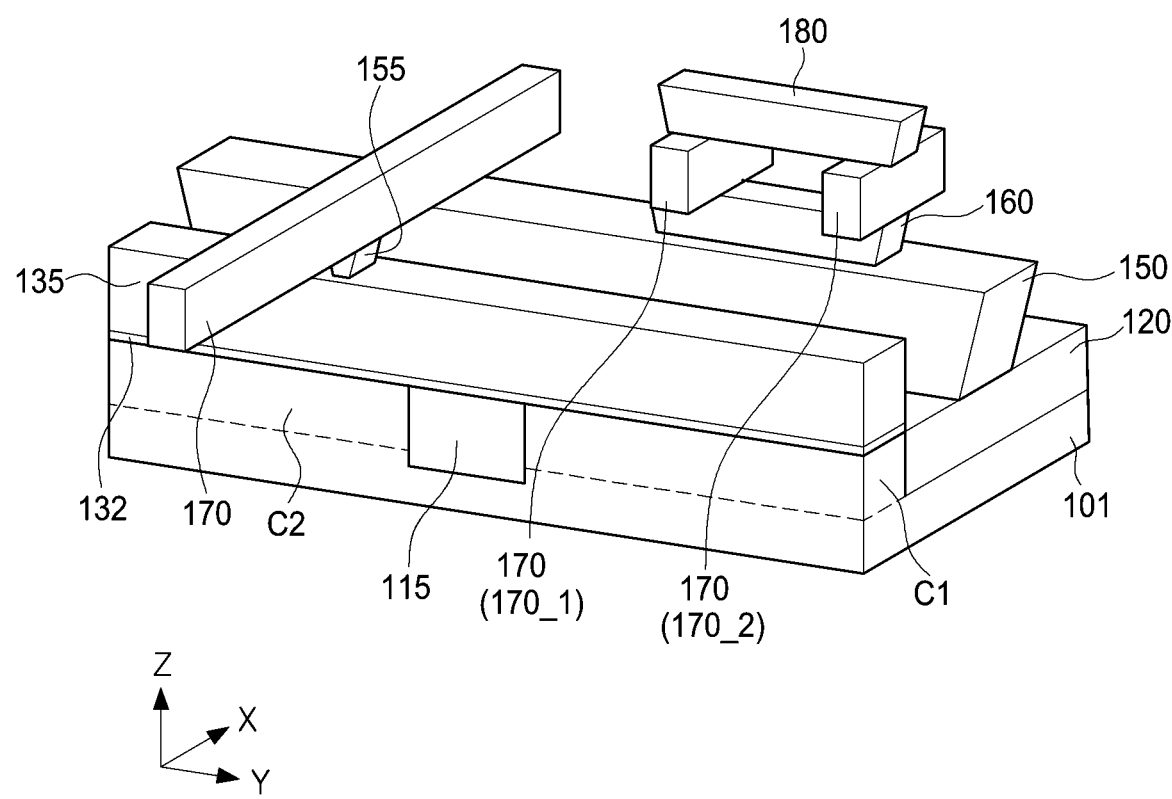
FIG. 4A is a schematic perspective view of a semiconductor device according to example embodiments.
Figure 4B:
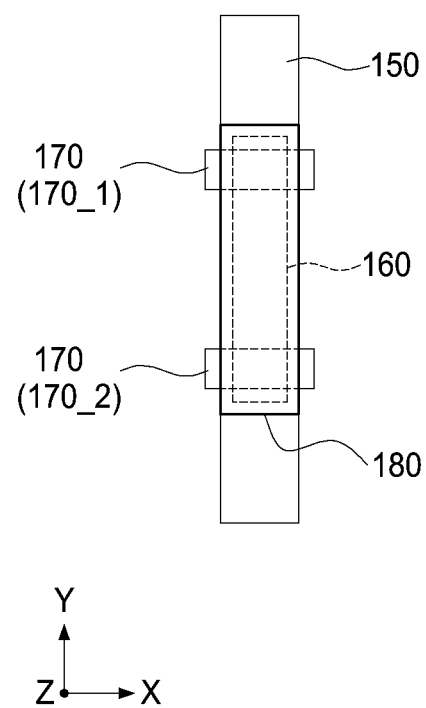
FIG. 4B is a schematic plan view illustrating an interconnection line structure of a semiconductor device according to example embodiments.

FIG. 4A is a schematic perspective view of a semiconductor device according to example embodiments, whereas FIG. 4B is a schematic plan view illustrating an interconnection line structure of a semiconductor device according to example embodiments. Referring to FIGS. 4A and 4B, in a semiconductor device 100D, a plurality of first metal interconnections 170 may have a via shape such that respective end portions thereof are disposed to be adjacent to side surfaces of the first via 160. The plurality of first metal interconnections 170 may provide a plurality of electrical signal paths from a contact structure 150 to a second via 180, which operates as a "double-stacked" via in combination with the first via. The plurality of first metal interconnections 170 may have a relatively smaller length in an X-direction than in the previous embodiment.

Figure 5A:
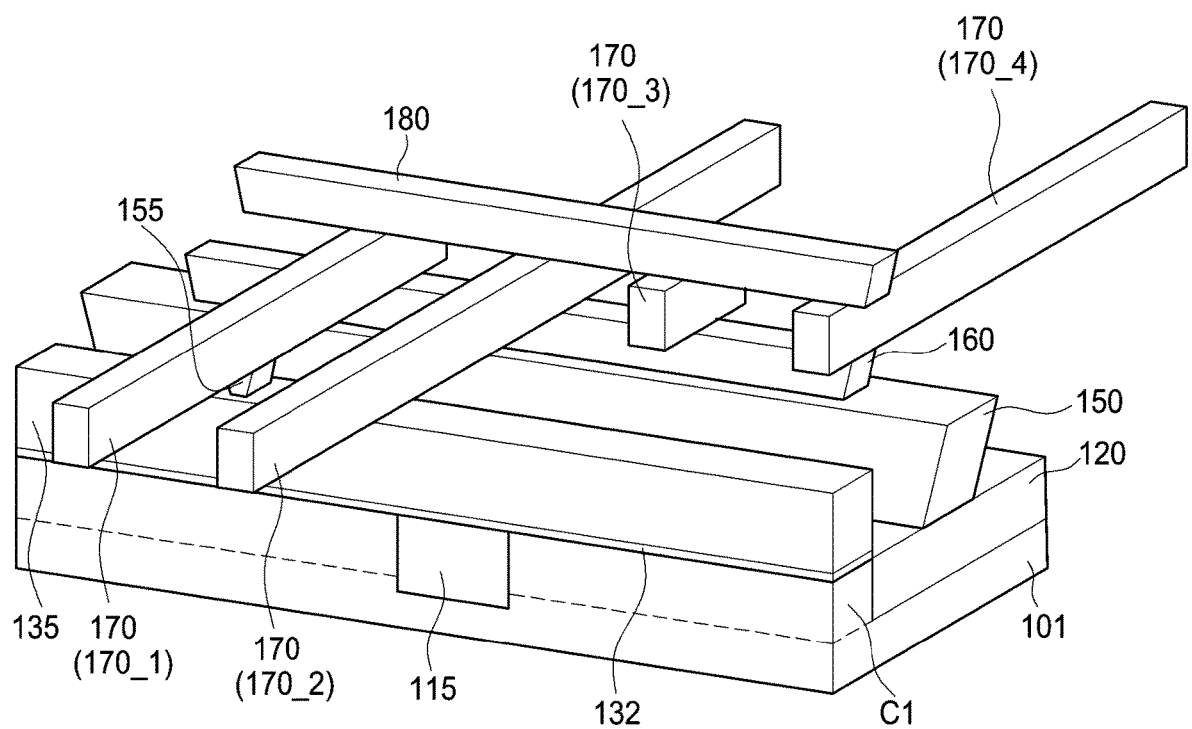
FIG. 5A is a schematic perspective view of a semiconductor device according to example embodiments.
Figure 5B:
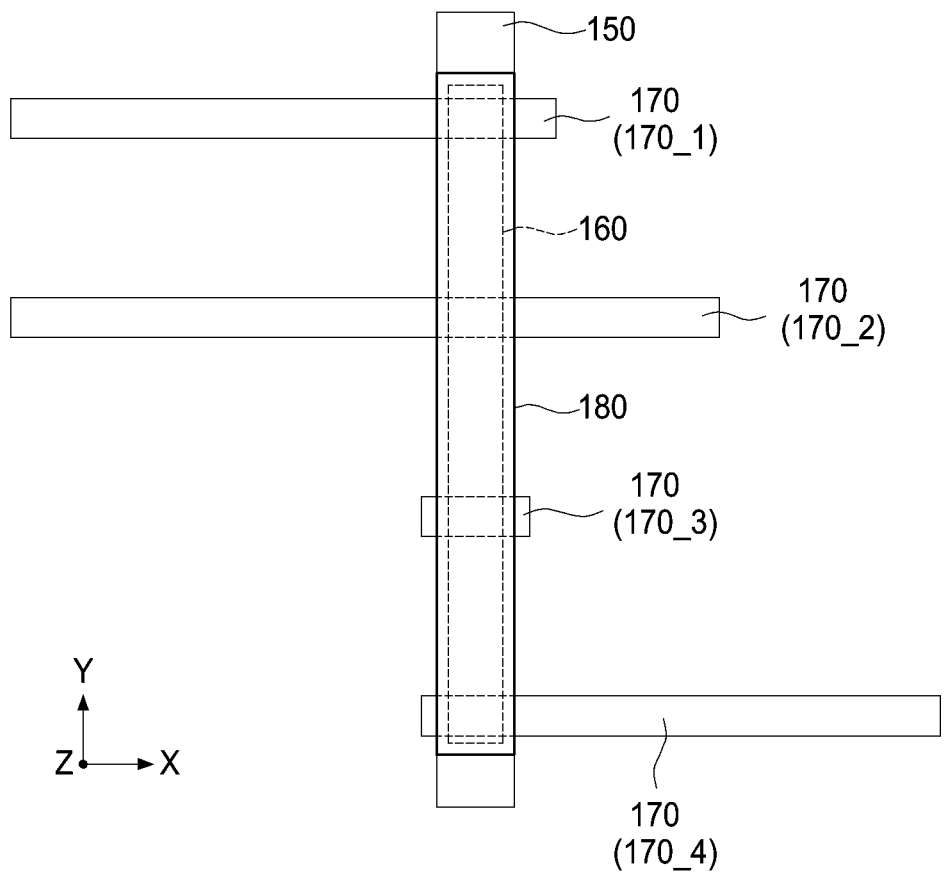
FIG. 5B is a schematic plan view illustrating an interconnection line structure of a semiconductor device according to example embodiments.

FIG. 5A is a schematic perspective view of a semiconductor device according to example embodiments, whereas FIG. 5B is a schematic plan view illustrating an interconnection line structure of a semiconductor device according to example embodiments. Referring to FIGS. 5A and 5B, a semiconductor device 100E may include first to fourth line patterns 170_1, 170_2, 170_3, and 170_4 in which a plurality of first metal interconnections 170 are connected to a first via 160. The first line pattern 170_1 may be connected to the gate electrode 135 through, for example, a gate contact structure 155, the third line pattern 170_3 may have a via shape as illustrated in FIGS. 4A and 4B, and the second line pattern 170_2 and the fourth line pattern 170_4 may extend to be longer in opposing directions with respect to the first via 160 as illustrated in FIGS. 3A and 3B.

Figure 6A:
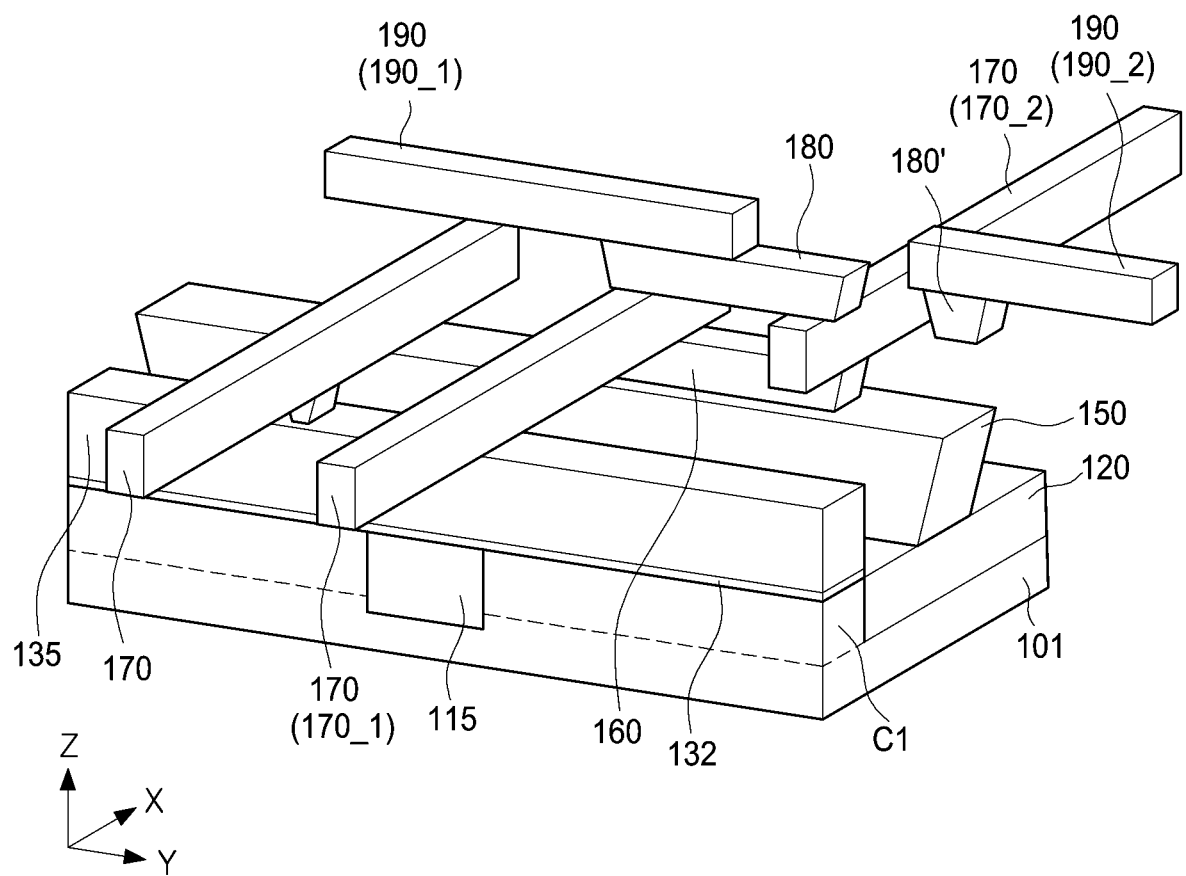
FIG. 6A is a schematic perspective view of a semiconductor device according to example embodiments.
Figure 6B:
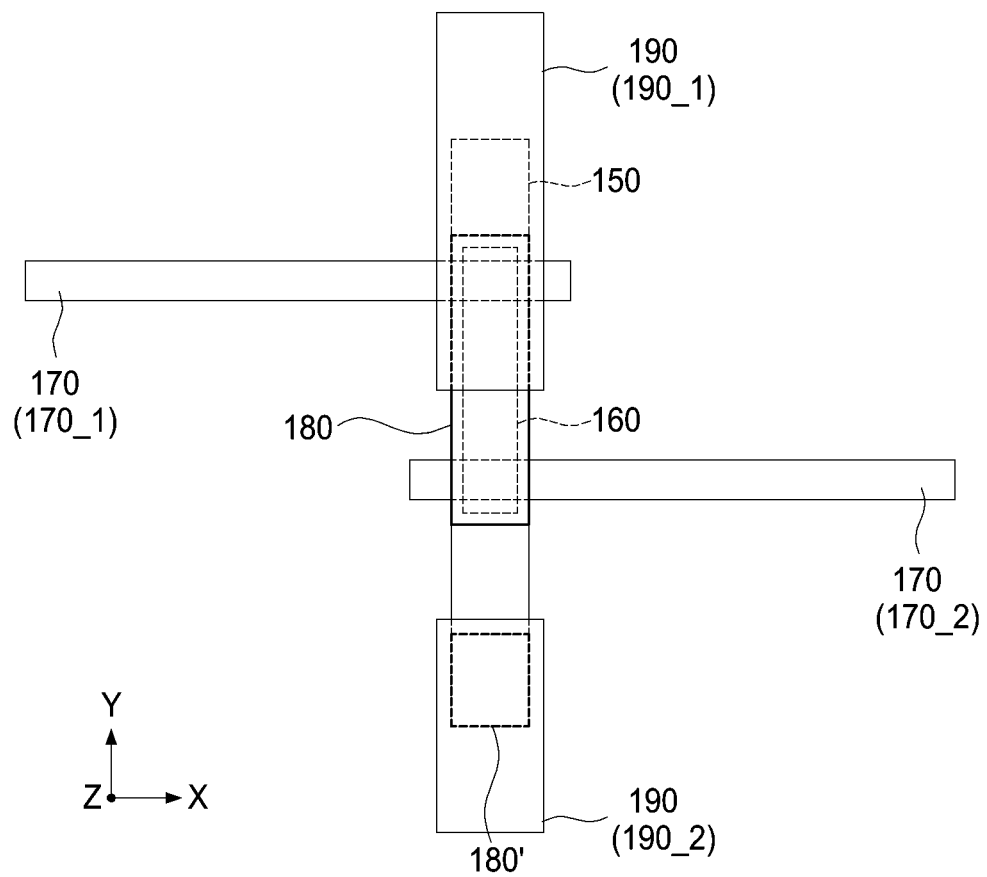
FIG. 6B is a schematic plan view illustrating an interconnection line structure of a semiconductor device according to example embodiments.

FIG. 6A is a schematic perspective view of a semiconductor device according to example embodiments, whereas FIG. 6B is a schematic plan view illustrating an interconnection line structure of a semiconductor device according to example embodiments. Referring to FIGS. 6A and 6B, a semiconductor device 100F may include a first via 160, a first metal interconnection 170 on the first via 160, and second via 180 and 180' on the first metal interconnection 170, and may further include second metal interconnections 190_1 and 190_2 on the second vias 180 and 180'. The second metal interconnections 190_1 and 190_2 may be connected to the second vias 180 and 180'. The second metal interconnections 190_1 and 190_2 may have a line shape or a bar shape extending in a Y-direction. The second via 180 may be formed to have a line shape or a bar shape and the second metal interconnections 190_1 and 190_2 may be disposed to partially overlap the second via 180 in a Z-direction, so that a stable distance between the plurality of second metal interconnections 190_1 and 190_2 on the second via 180 may be secured. For example, the second metal interconnection 190_1 may be in contact with a portion of an upper surface of the second via 180. For example, the plurality of second metal interconnections 190_1 and 190_2 may be designed in a layout while satisfying a tip-to-tip (T2T) spacing rule, and even when a spacing between adjacent second vias 180 and 180' in the Y-direction is narrow, one of the second vias 180 may be formed to have a line long in the Y-direction. Therefore, a desired layout of a semiconductor device may be designed while stably satisfying the tip-to-tip spacing rule.

Figure 7A:
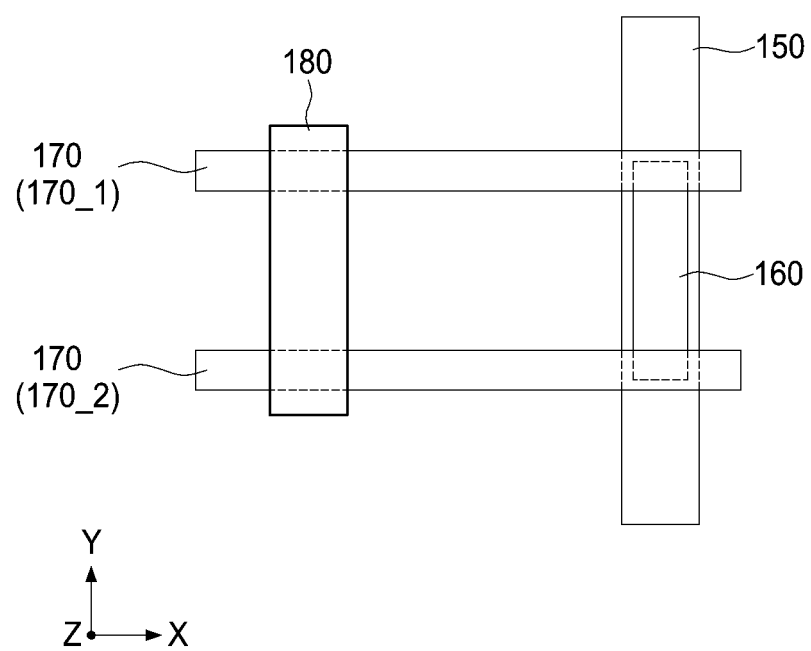
FIGS. 7A to 7D are schematic plan views illustrating an interconnection line structure of a semiconductor device according to example embodiments.
Figure 7B:
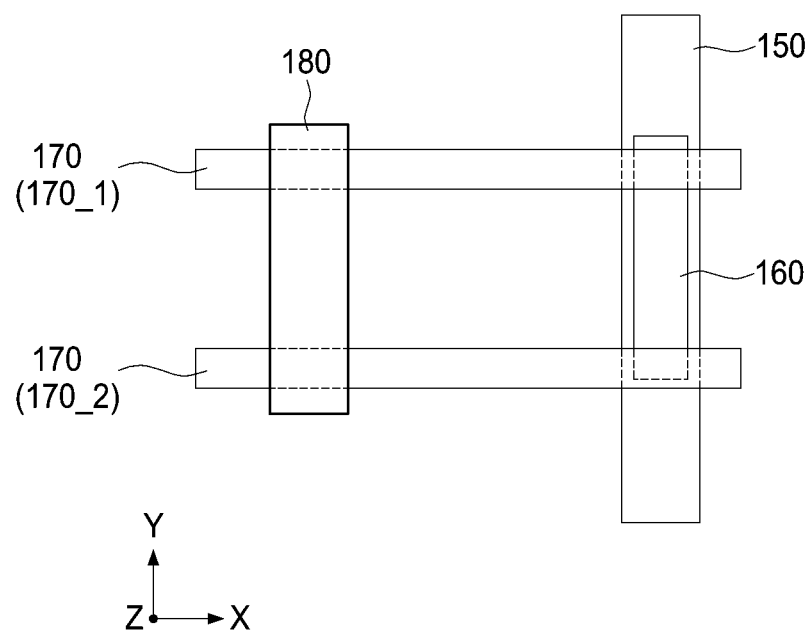
Figure 7C:
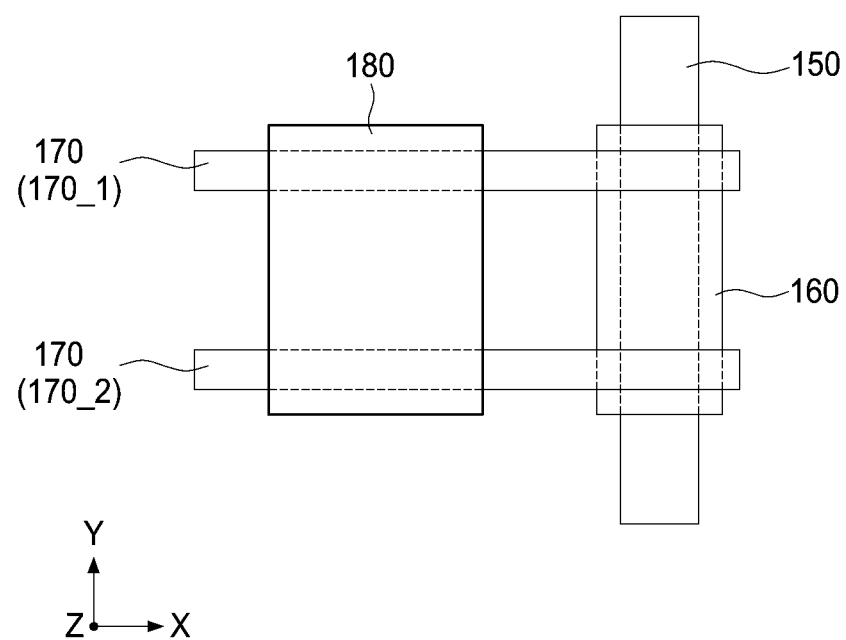
Figure 7D:
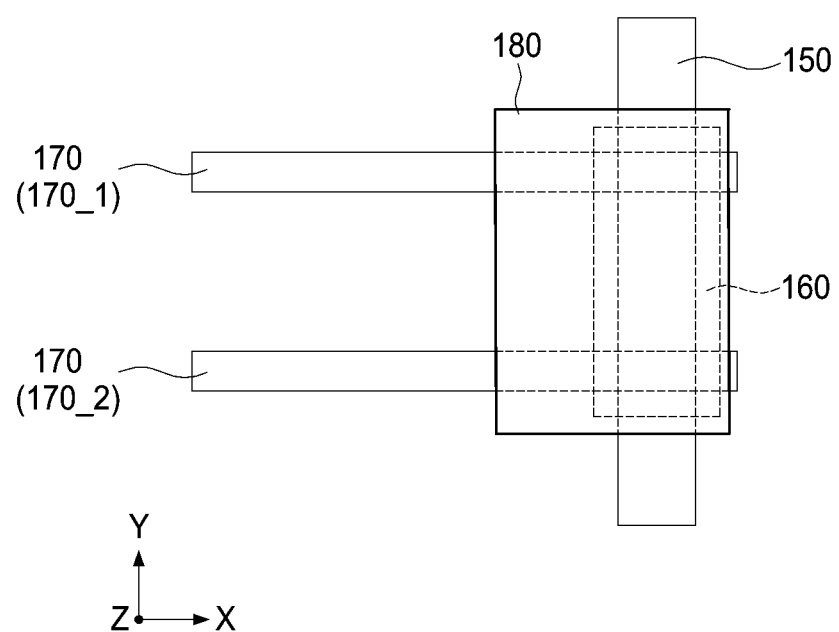

FIGS. 7A to 7D are schematic plan views illustrating an interconnection line structure of a semiconductor device according to example embodiments. Referring to FIGS. 7A and 7B, at least one of opposite end portions of the first via 160 in a Y-direction may be disposed to overlap a plurality of first metal interconnections 170 in a Z-direction. Referring to FIGS. 7C and 7D, a first via 160 and a second via 180 may have an increased width in an X-direction, as compared with the previous embodiment. In addition, a first via 160 and a second via 180 may not overlap each other in a Z-direction as illustrated in FIG. 7C, whereas a first via 160 and a second via 180 may overlap each other in a Z-direction as illustrated in FIG. 7D.

Figure 8A:
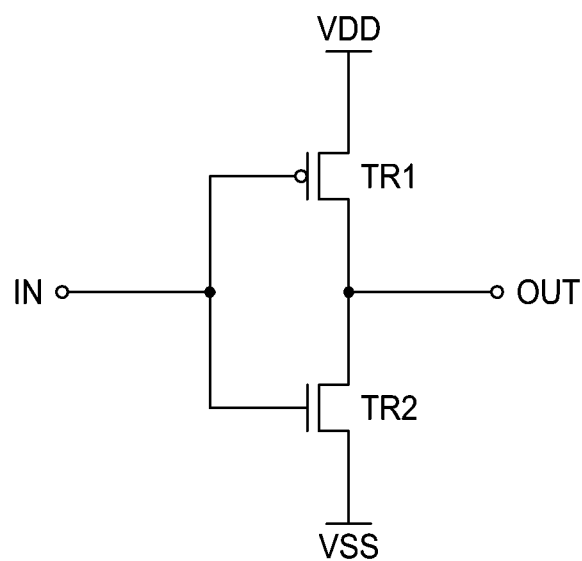
FIGS. 8A and 8B are circuit diagrams of a unit circuit provided by a standard cell included in a semiconductor device according to example embodiments, respectively.
Figure 8B:
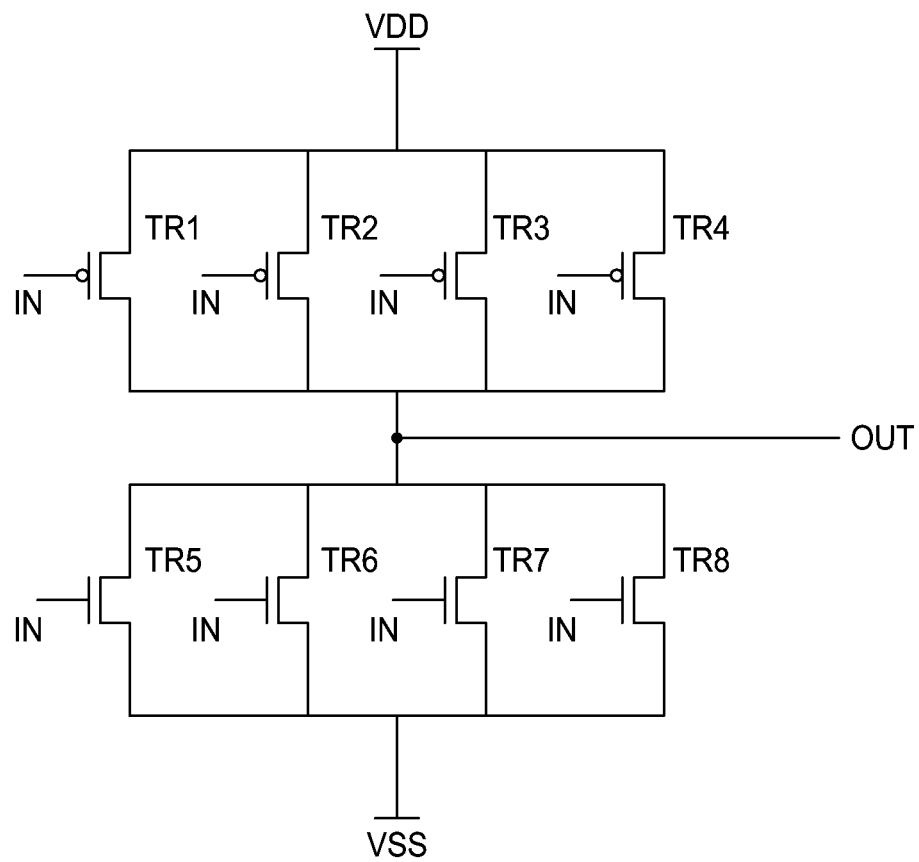

FIGS. 8A and 8B are circuit diagrams of a unit circuit provided by a standard cell included in a semiconductor device according to example embodiments, respectively. Referring to FIG. 8A, a unit circuit may be an inverter circuit. The inverter circuit may include a PMOS pull-up device/transistor TR1, receiving first power VDD, and an NMOS pull-down device/transistor TR2 receiving second power VSS. Gates of the pull-up device TR1 and the pull-down device TR2 may be connected to each other to provide an input terminal IN. On the other hand, a drain region of the pull-up device TR1 and a drain region of the pull-down device TR2 may be connected to each other to provide an output terminal OUT.

Referring to FIG. 8B, an exemplary circuit may include first to fourth PMOS transistors TR1, TR2, TR3, and TR4, receiving the first power VDD, and first to fourth NMOS transistors TR5, TR6, TR7, and TR8 receiving second power VSS. Gates of the first to fourth PMOS transistors TR1, TR2, TR3, and TR4 and the first to fourth NMOS transistors TR5, TR6, TR7, and TR8 may provide an input terminal IN. A drain region of each of the first to fourth PMOS transistors TR1, TR2, TR3, and TR4 and a drain region of each of the first to fourth NMOS transistors TR5, TR6, TR7, and TR8 may be connected to each other to provide an output terminal OUT. However, the circuits illustrated in FIGS. 8A and 8B are only examples of unit circuits which may be provided utilizing a standard cell. For example, standard cells may also provide various circuits such as a NAND circuit or a NOR circuit, other than such circuits.

Figure 9:
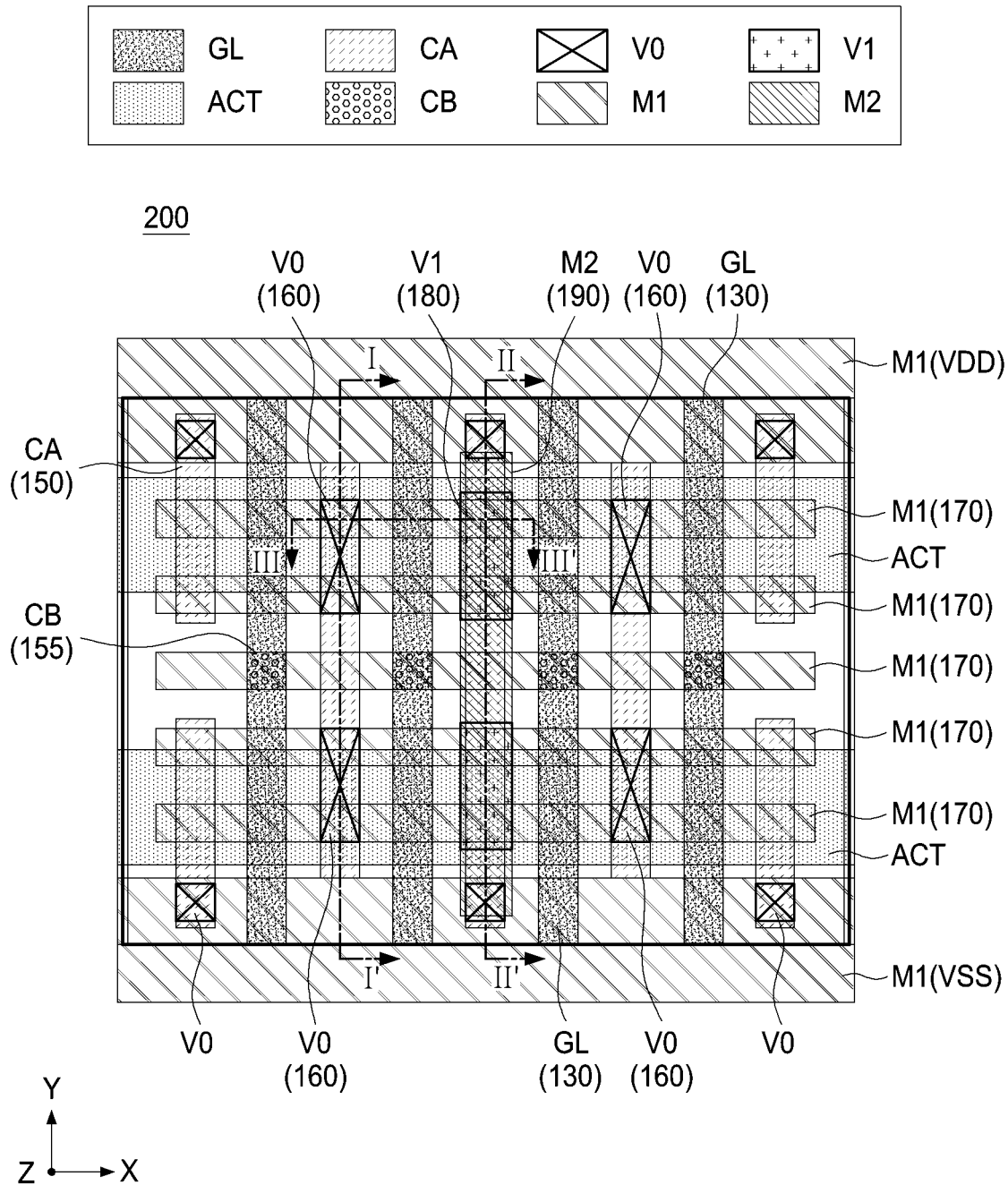
FIG. 9 is a layout diagram of a semiconductor device according to example embodiments.
Figure 10A:
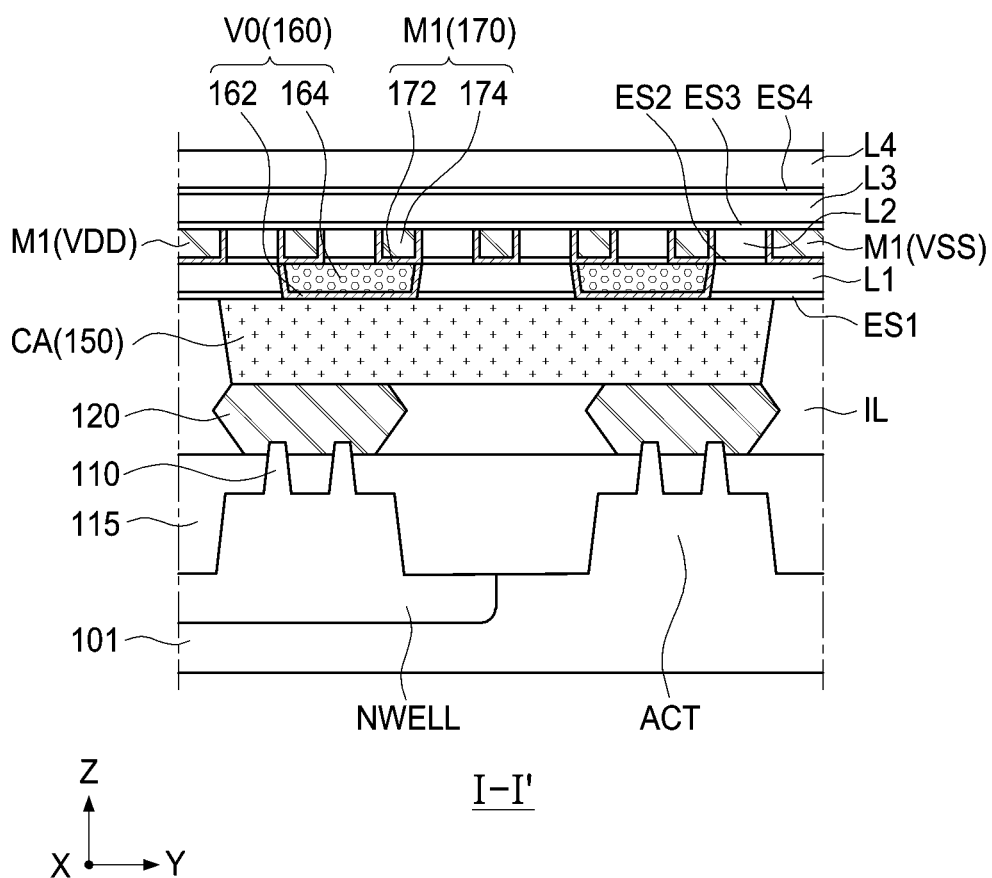
FIGS. 10A to 10C are cross-sectional views of a semiconductor device according to example embodiments.
Figure 10B:
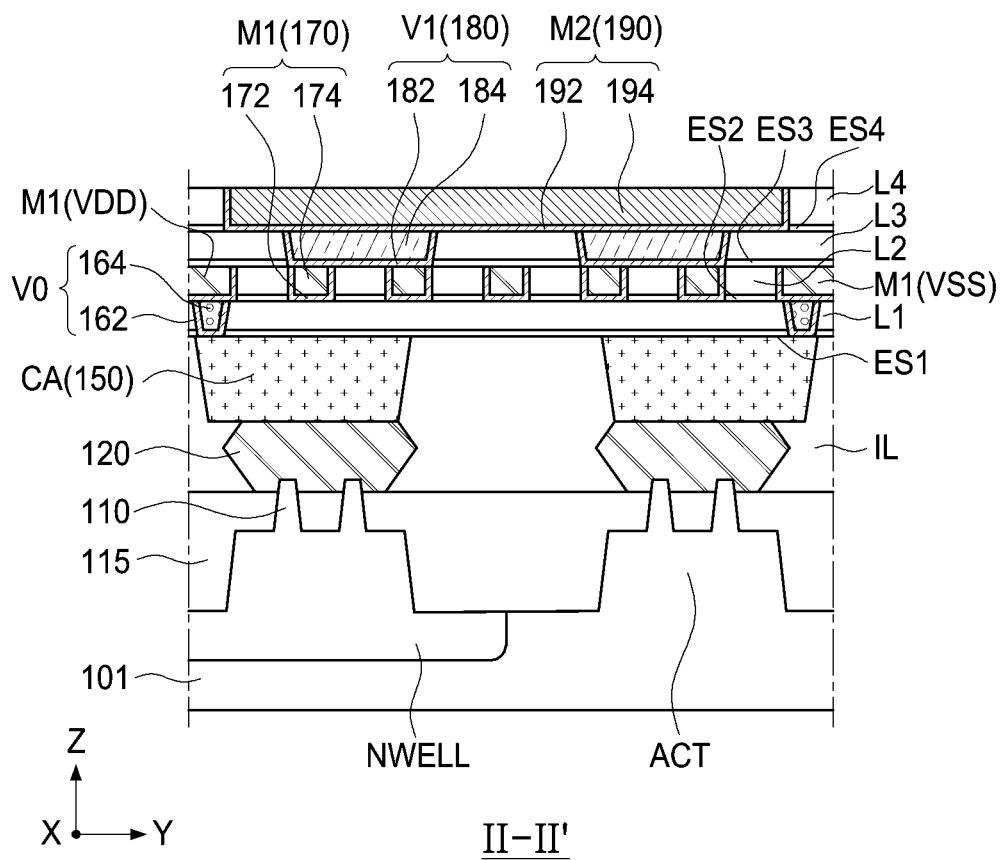

FIG. 9 is a layout diagram of a semiconductor device according to example embodiments. The layout of FIG. 9 may correspond to a layout of a semiconductor device corresponding to the eight (8) transistor "inverter" circuit of FIG. 8B. In addition, FIGS. 10A to 10O are cross-sectional views of a semiconductor device according to example embodiments. In particular, FIGS. 10A to 10O illustrate exemplary cross-sections of the semiconductor device of FIG. 9 taken along lines I-I', II-', and III-III', respectively. For ease of description, only main components of the semiconductor device are illustrated in FIGS. 10A to 10C.

Figure 10C:
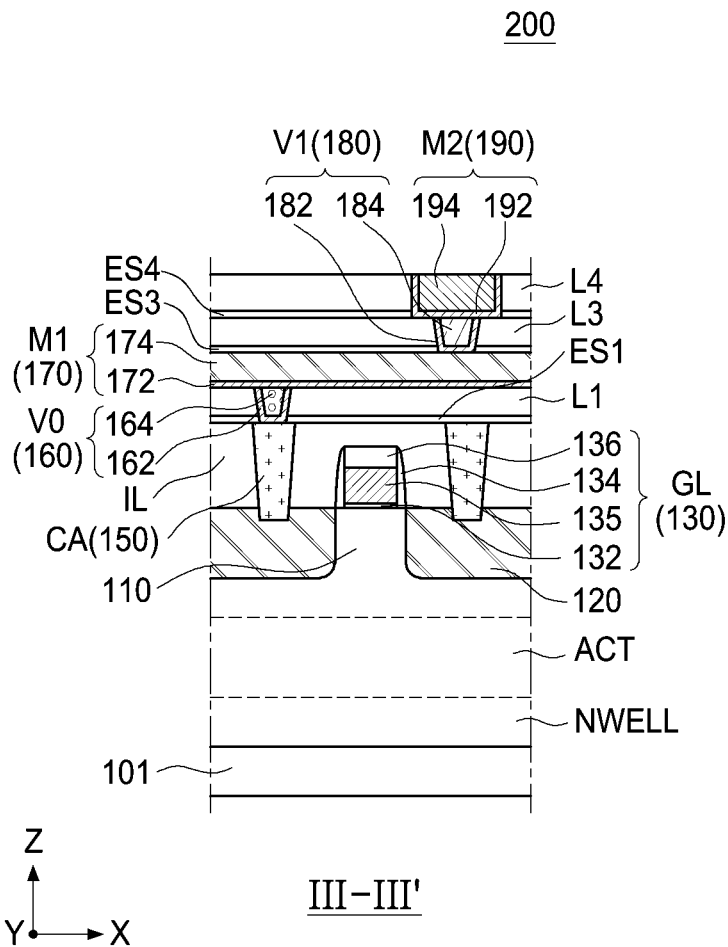

Referring to FIGS. 9 to 10C, a semiconductor device 200 may include a substrate 101, active regions ACT each including an active fin 110, a device isolation layer 115, source/drain regions 120, gate structures GL (130) each including a gate electrode 135, a lower interlayer insulating layer IL, a contact structure CA (150), a first via V0 (160), first interconnection lines M1, a second via V1 (180), and a second interconnection line M2. The semiconductor device 200 may further include interlayer insulating layers L1, L2, L3, and L4 and etch-stop layers ES1, ES2, ES3, and ES4. The semiconductor device 200 may include FinFET devices, transistors in which active regions ACT include active fins 110 having a fin structure.

The substrate 101 may include a semiconductor material, for example, a group IV semiconductor, a group III-V compound semiconductor, or a group II-VI compound semiconductor. For example, the group IV semiconductor may include silicon, germanium, or silicon-germanium. The substrate 101 may be provided as a bulk wafer, an epitaxial layer, an epitaxial layer, a silicon-on-insulator (SOI) layer, a semiconductor-on-insulator layer, or the like. The substrate 101 may include doped regions such as N-well regions NWELL.

The device isolation layer 115 may define active regions ACT in the substrate 101. The device isolation layer 115 may be formed by, for example, a shallow trench isolation (STI) process. As illustrated in FIG. 10A, the device isolation layer 115 may include a region extending deeper downwardly of the substrate 101 between adjacent active regions ACT, but example embodiments are not limited thereto. In some embodiments, the device isolation layer 115 may have a curved upper surface having a level becoming higher in a direction toward the active fins 110. The device isolation layer 115 may be formed of an insulating material and may include, for example, an oxide, a nitride, or a combination thereof.

The active regions ACT may be defined by the device isolation layer 115 in the substrate 101 and may be disposed to extend in a first direction, for example, an X-direction. The active fins 110 may protrude from the substrate 101. Upper ends of the active fins 110 may be disposed to protrude from an upper surface of the device isolation layer 115 by a predetermined height. The active fins 110 may be formed as a portion of the substrate 101, or may include an epitaxial layer grown from the substrate 101. A portion of the active fins 110 may be recessed on opposite sides adjacent to the gate structures 130, and source/drain regions 120 may be disposed on the recessed active fins 110. In some embodiments, the active regions ACT may have doped regions including impurities. For example, the active fins 110 may include impurities diffused from the source/drain regions 120 in a region in contact with the source/drain regions 120. According to example embodiments, the active fins 110 may be omitted. In this case, the active regions ACT may have a structure having a planar upper surface.

The source/drain regions 120 may be disposed on recess regions, in which the active fins 110 are recessed, on opposite sides adjacent to the gate structures 130. The source/drain regions 120 may be provided as a source region or a drain region of the transistors. Upper surfaces of the source/drain regions 120 may be disposed at a height the same as or similar to a level of lower surfaces of the gate structures 130, in the cross-section taken in the X-direction of FIG. 10C. However, a relative height of the source/drain regions 120 and the gate structures 130 may vary according to example embodiments.

The source/drain regions 120 may have a merged shape in which they are connected to each other between the active fins 110 adjacent to each other in a Y-direction as illustrated in FIG. 10A, but example embodiments are not limited thereto. The source/drain regions 120 may have a shape in which side surfaces thereof are angled in a cross-section taken in the Y-direction of FIG. 10A. However, in example embodiments, the source/drain regions 120 may have various shapes and may have one of, for example, a polygonal shape, a circular shape, an elliptical shape, and a rectangular shape.

The source/drain regions 120 may include an epitaxial layer and may include, for example, silicon (Si), silicon germanium (SiGe), or silicon carbide (SiC). The source/drain regions 120 may further include impurities such as arsenic (As) and/or phosphorus (P). In example embodiments, the source/drain regions 120 may include a plurality of regions including elements having different concentration and/or doping elements.

The gate structures 130 may be disposed on the active regions ACT to intersect the active regions ACT and to extend in one direction, for example, the Y-direction. Channel regions of transistors may be formed in the active fins 110 intersecting the gate structures 130. The gate electrode 135 may include a gate dielectric layer 132, a gate electrode 135, gate spacer layers 134, and a gate capping layer 136.

The gate dielectric layer 132 may be disposed between the active fin 110 and the gate electrode 135. In example embodiments, the gate dielectric layer 132 may include a plurality of layers or may be disposed to extend upwardly of a side surface of the gate electrode 135. The gate dielectric layer 132 may include an oxide, a nitride, or a high-k dielectric material. The high-k dielectric material may refer to a dielectric material having a dielectric constant higher than that of silicon oxide ($SiO_2$).

The gate electrode 135 may include a conductive material, for example, metal nitride such as titanium nitride (TiN), tantalum nitride (TaN), or tungsten nitride (WN), and/or a metal such as aluminum (Al), tungsten (W), or molybdenum (Mo), or a semiconductor material such as doped polysilicon. The gate electrode 135 may have a multilayer structure including two or more layers. The gate electrode 135 may be disposed to be separated from each other between at least some adjacent transistors in the Y-direction, depending on a circuit configuration of the semiconductor device 200. For example, the gate electrode 135 may be separated by an additional gate separation layer. The gate electrodes 135 may each be connected to a gate contact structure (CB) 155 in a single standard cell to provide the circuit of FIG. 8B, and may be electrically connected to each other through a first metal interconnection M1 (170) in an overlying portion.

The gate spacer layers 134 may be disposed on opposite side surfaces of the gate electrode 135. The gate spacer layers 134 may insulate the source/drain regions 120 from the gate electrode 135. The gate spacer layers 134 may have a multilayer structure according to example embodiments. The gate spacer layers 134 may be formed of an oxide, a nitride, or an oxynitride and, for example, a low-k dielectric material. The gate spacer layers 134 may be formed of at least one of, for example, SiO, SiN, SiCN, SiOC, SiON, and SiOCN.

The gate capping layer 136 may be disposed on the gate electrode 135, and a lower surface and side surfaces thereof may be surrounded by the gate electrode 135 and the gate spacer layers 134, respectively. The gate capping layer 136 may be formed of, for example, an oxide, a nitride, and an oxynitride.

The lower interlayer insulating layer IL may be disposed to cover the source/drain regions 120 and the gate structures 130. The lower interlayer insulating layer IL may include at least one of, for example, an oxide, a nitride, and an oxynitride, and may include a low-k dielectric material.

The contact structures CA (150) may be connected to the source/drain regions 120 through the lower interlayer insulating layer IL, and may apply an electrical signal to the source/drain regions 120. The contact structures CA (150) may be disposed to recess the source/drain regions 120 to a predetermined depth, but example embodiments are not limited thereto. The contact structures CA (150) may include a conductive material, for example, a metal such as tungsten (W), aluminum (Al), copper (Cu), or the like, or a semiconductor material such as doped polysilicon. In some embodiments, the contact structures CA (150) may include a barrier metal layer disposed along an external surface. Also, in some embodiments, the contact structures CA (150) may further include a metal-semiconductor compound layer such as a silicide layer disposed on an interface in contact with the source/drain regions 120.

The interlayer insulating layers L1, L2, L3, and L4 may cover the contact structures CA (150), and may be disposed on the same level as an interconnection structure including the first via V0 (160), the first interconnection lines M1, the second via V1 (180), and the second interconnection lines M2. The interlayer insulating layers L1, L2, L3, and L4 may include first to fourth insulating layers L1, L2, L3, and L4, and may be disposed on the same levels the first via V0 (160), the first interconnection line M1, the second via V1 (180), and the second interconnection lines M2. The interlayer insulating layers L1, L2, L3, and L4 may be formed of silicon oxide or a low-k dielectric material. The interlayer insulating layers L1, L2, L3, and L4 may include at least one of, for example, SiO, SiN, SiCN, SiOC, SiON, and SiOCN.

The etch-stop layers E81, E82, E83, and E84 may be disposed on a lower surface of each of the first to fourth insulating layers L1, L2, L3, and L4. The etch-stop layers E81, E82, E83, and E84 may serve as an etch-stop layer in an etching process of forming the first via V0 (160), the first interconnection lines M1, the second via V1 (180), and the second interconnection lines M2. The etch-stop layers E81, E82, E83, and E84 may include a high-k material, for example, silicon nitride or aluminum oxide.

The first via V0 (160), the first interconnection lines M1, the second via V1 (180), and the second interconnection lines M2, constituting the interconnection structure, may be sequentially stacked from an underlying portion. The first via V0 (160), the first interconnection lines M1, the second via V1 (180), and the second interconnection lines M2, stacked from an underlying portion to an overlying portion, may have a relatively greater thickness as they are disposed on a higher upper portion, but example embodiments are not limited thereto.

According to example embodiments, a first via V0 (160) and a second via V1 (180) may be formed to intersect the plurality of first interconnection lines M1 (170). The first via V0 (160) and the second via V1 (180) may have a line shape or a bar shape in which a length in a Y-direction is greater than a length in an X-direction. Accordingly, a plurality of electrical signal paths may be provided from the contact structure CA (150) to the plurality of first interconnection lines M1 (170), and electrical resistance in a vertical direction may be further reduced than when the single contact structure CA (150) and the single interconnection line M1 (170) are electrically connected to each other.

Each of the first via V0 (160), the first interconnection lines M1, the second via V1 (180), and the second interconnection lines M2 may include barrier layers 162, 172, 182 and 192 and conductive layers 164, 174, 184, and 194. Each of the barrier layers 162, 172, 182, and 192 may cover a side surface and a bottom surface of each of the conductive layers 164, 174, 184, and 194. The barrier layers 162, 172, 182, and 192 may include at least one of, for example, titanium (Ti), titanium nitride (TiN), tantalum (Ta), tantalum nitride (TaN), tungsten nitride (WN), and tungsten carbon nitride (WCN). The conductive layers 164, 174, 184, and 194 may include at least one of, for example, ruthenium (Ru), molybdenum (Mo), tungsten (W), copper (Cu), aluminum (Al), and cobalt (Co).

The first interconnection lines M1 may include a first power supply line M1 (VDD) and a second power supply line M1 (VSS) supplying different potentials to a device region including the active regions ACT and the gate electrode 135. For example, the first power supply line M1 (VDD) and the second power supply line M1 (VSS) may supply different potentials to a standard cell disposed therebetween. For example, the first power supply line M1 (VDD) may supply first power VDD to a standard cell and the second power supply line M1 (VSS) may provide second power VSS to the standard cell, and the first power VDD may be higher than the second power VSS. The first power supply line M1 (VDD) and the second power supply line M1 (VSS) may extend in the X-direction and may be arranged to be spaced apart from each other in the Y-direction. A structure, similar to the first via V0 (160) described herein, may be applied to the power distribution patterns on the first power supply line M1 (VDD) and the second power supply line M1 (VSS), so that contact resistance between a power supply line and a second interconnection line may be reduced to improve electrical characteristics of the semiconductor device. The first via VO, disposed between the power supply lines M1 (VDD) and M1 (VSS) and the contact structure CA (150), may be referred to as a "power supply line connection via."

The first interconnection lines M1 may be disposed side by side on substantially the same height level as the first power supply line M1 (VDD) and the second power supply line M1(VSS), and may further include a plurality of first metal interconnections M1 (170) extending in the X-direction. The first via V0 (160) may be disposed below the plurality of first metal interconnections M1 (170) to electrically connect the plurality of first metal interconnections M1 (170) to each other, and may extend in the Y-direction to have a length greater than or equal to a minimum separation distance between the first metal interconnections M1 (170). The second via V1 (180) may be disposed on the plurality of first metal interconnections M1 (170) to electrically connect the plurality of first metal interconnections M1 (170) to each other, and may extend in the Y-direction to have a length greater than or equal to the minimum separation distance between the first metal interconnections M1 (170).

Figure 11:
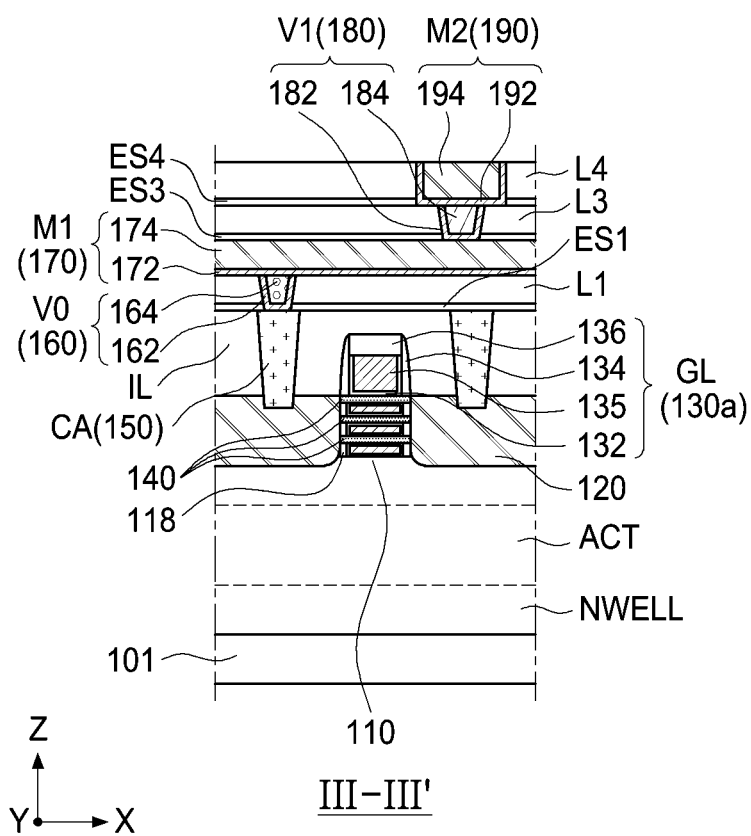
FIG. 11 is a cross-sectional view of a semiconductor device according to example embodiments.

FIG. 11 is a cross-sectional view of a semiconductor device according to example embodiments. FIG. 11 illustrates a region corresponding to FIG. 10C. Referring to FIG. 11, a semiconductor device 200A may further include a plurality of channel layers 140, vertically spaced apart from each other on active regions ACT, and internal spacer layers 118 disposed side by side with a gate electrode 135 between the plurality of channel layers 140. The semiconductor device 200A may include transistors gate-all-around type transistors disposed between an active fin 110 and channel layers 140 and between the plurality of channel layers 140 having a nanosheet shape. For example, the semiconductor device 200A may include transistors having a multi-bridge channel FET (MBCFET™) structure formed by channel layers 140, source/drain regions 120, and a gate structure 130a.

The plurality of channel layers 140 may include two or more channel layers disposed to be spaced apart from each other on the active region ACT in a direction, perpendicular to an upper surface of an active fin 110, for example, a Z-direction. The channel layers 140 may be connected to source/drain regions 120 and may be spaced apart from upper surfaces of the active fin 110. The channel layers 140 may have a width the same as or similar to a width of the active fin 110 in a Y-direction, and may have the same or similar width as the gate structure 130a in an X-direction. However, in some embodiments, the channel layers 140 may have a decreased width such that side surfaces thereof are disposed below the gate structure 130a in the X-direction.

The plurality of channel layers 140 may be formed of a semiconductor material, and may include at least one of, for example, silicon (Si), silicon germanium (SiGe), and germanium (Ge). The channel layers 140 may be formed of, for example, the same material as the substrate 101. The number and shape of the channel layers 140, constituting a single channel structure, may vary according to example embodiments. For example, in some embodiments, a channel layer may be further disposed in a region in which the active fin 110 is in contacts with the gate electrode 135.

The gate structure 130a may be disposed on the active fins 110 and the plurality of channel layers 140 to extend and intersect the active fins 110 and the plurality of channel layers 140. Channel regions of transistors may be formed in the active fins 110 and the plurality of channel layers 140 intersecting the gate structure 140a. In the present embodiment, the gate dielectric layer 132 may be disposed between the plurality of channel layers 140 and the gate electrode 135, as well as between the active fin 110 and the gate electrode 135. The gate electrode 135 may be disposed on the active fins 110 to fill a space between the plurality of channel layers 140 and to extend upwardly of the plurality of channel layers 140. The gate electrode 135 may be spaced apart from the plurality of channel layers 140 by a gate dielectric layer 132.

Internal spacer layers 118 may be disposed to be parallel to the gate electrode 135 between the plurality of channel layers 140. The gate electrode 135 may be spaced apart from the source/drain regions 120 by the internal spacer layers 118 to be electrically separated therefrom. The internal spacer layers 118 may have a planar side surface opposing the gate electrode 135, or may have a shape convexly rounded inwardly of the gate electrode 135. The internal spacer layers 118 may be formed of an oxide, a nitride, or an oxynitride and, for example, a low-k dielectric material.

Figure 12:
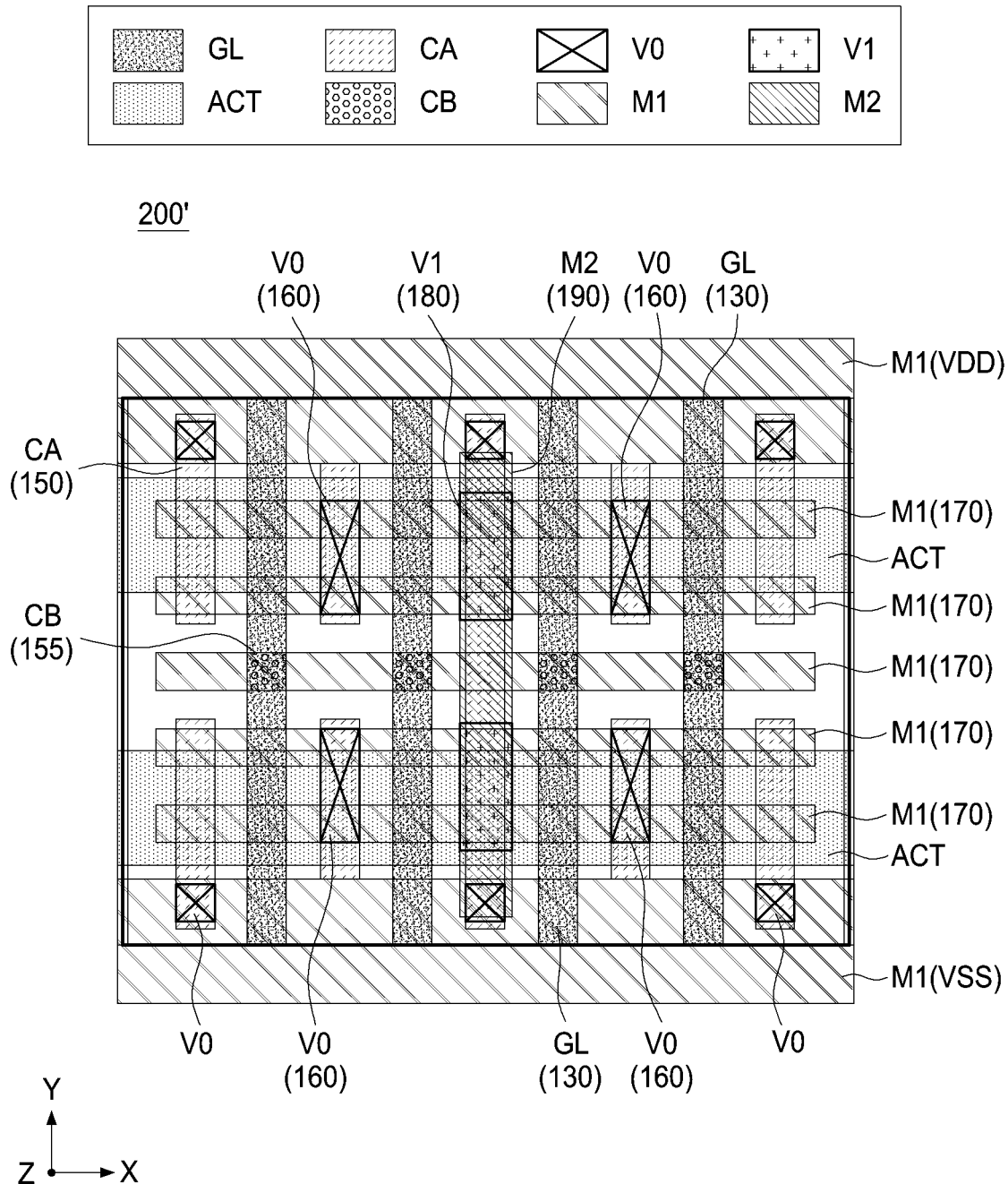
FIG. 12 is a layout diagram of a semiconductor device according to example embodiments.

FIG. 12 is a layout diagram of a semiconductor device according to example embodiments. Referring to FIG. 12, the layout of the semiconductor device 200' is similar to the layout of the semiconductor device of FIG. 9; however, in FIG. 12, some of the contact structures CA (150) are separated by a contact separation structure (not shown). For example, the contact structure CA (150) extending in the Y direction may not share the active regions ACT spaced apart from each other in the Y direction. In FIG. 9, one contact structure CA (150) may share two active regions ACT, one contact structure CA (150) in FIG. 12 may be separated in two by a contact separation structure and two contact structures CA (150) may be disposed on the two active regions ACT, respectively.

As described above, vias connected to a plurality of metal interconnections are provided on a contact structure, so that a semiconductor device having improved electrical characteristics and reliability may be provided.

While example embodiments have been shown and described above, it will be apparent to those skilled in the art that modifications and variations could be made without departing from the scope of the present inventive concept as defined by the appended claims.

What is claimed is:

1. A semiconductor device, comprising:
an active region within a substrate in a first direction;
a gate electrode intersecting the active region and extending in a second direction, perpendicular to the first direction;
a contact structure overlapping the active region on one side of the gate electrode and extending in the second direction;
a first via disposed on the contact structure to be connected to the contact structure and having a shape in which a length in the second direction is greater than a length in the first direction;
a plurality of first metal interconnections extending in the first direction on the first via, wherein at least two of the plurality of first metal interconnections are in contact with a same first surface of the first via; and
a second via disposed on the plurality of first metal interconnections, wherein a same first surface of the second via is in contact with the at least two of the plurality of first metal interconnections, and wherein the second via has a shape in which a length in the second direction is greater than a length in the first direction,
wherein the first via is a first single element and the second via is a second single element.

2. The semiconductor device of claim 1, wherein each of the first via and the second via is disposed to intersect the plurality of first metal interconnections.

3. The semiconductor device of claim 1, wherein the plurality of first metal interconnections include a pair of first metal interconnections parallel to each other and spaced apart from each other, and
wherein the pair of first metal interconnections are in contact with the first via.

4. The semiconductor device of claim 3, wherein the pair of first metal interconnections include portions facing each other in the second direction.

5. The semiconductor device of claim 1, wherein the first via has a first side surface and a second side surface opposing each other in the first direction, and
wherein the plurality of first metal interconnections include a first line pattern, disposed to be in contact with a first portion of an upper surface of the first via and to extend on the first side surface of the first via, and a second line pattern disposed to be in contact with a second portion of the upper surface of the first via and to extend on the second side surface of the first via.

6. The semiconductor device of claim 1, wherein the plurality of first metal interconnections have a via shape such that end portions of each of the first metal interconnections are disposed to be adjacent to side surfaces of the first via.

7. The semiconductor device of claim 1, wherein among end portions of the first via opposing each other in the second direction, at least one end portion is disposed to overlap the plurality of first metal interconnections in a vertical direction, perpendicular to an upper surface of the substrate.

8. The semiconductor device of claim 1, wherein the first via, the plurality of first metal interconnections, and the second via form a grid pattern in a plan view.

9. The semiconductor device of claim 1, further comprising:
a second metal interconnection disposed on the second via to be connected to the second via and extending in the second direction, the second metal interconnection being in contact with a portion of an upper surface of the second via in a direction, perpendicular to an upper surface of the second via.

10. The semiconductor device of claim 1, wherein the contact structure is connected to a source/drain region disposed on the active region on opposite sides adjacent to the gate electrode.

11. The semiconductor device of claim 1, wherein a first portion of the first via is in contact with a first one of the plurality of first metal interconnections,
wherein a second portion of the first via is integral with the first portion of the first via and is in contact with a second one of the plurality of first metal interconnections,
wherein a first portion of the second via is in contact with the first one of the plurality of first metal interconnections, and
wherein a second portion of the second via is integral with the first portion of the second via and is in contact with the second one of the plurality of first metal interconnections.

12. The semiconductor device of claim 11, wherein the first one of the plurality of first metal interconnections and the second one of the plurality of first metal interconnections are spaced apart from each other by a gap,
wherein a third portion of the first via partially overlaps the gap and is not in contact with the plurality of first metal interconnections, and wherein a third portion of the second via partially overlaps the gap and is not in contact with the plurality of first metal interconnections.

13. The semiconductor device of claim 11, wherein the first portion of the first via at least partially overlaps the first portion of the second via, and
wherein the second portion of the first via at least partially overlaps the second portion of the second via.

14. The semiconductor device of claim 1, wherein the same first surface of the first via at least partially overlaps the same first surface of the second via.

15. The semiconductor device of claim 1, wherein a bottom surface of a first one of the plurality of first metal interconnections is in contact with the same first surface of the first via, and
wherein a bottom surface of a second one of the plurality of first metal interconnections is in contact with the same first surface of the first via.

16. The semiconductor device of claim 15, wherein a top surface of a first one of the plurality of first metal interconnections is in contact with the same first surface of the second via, and
wherein a top surface of a second one of the plurality of first metal interconnections is in contact with the same first surface of the second via.

17. A semiconductor device comprising:
a channel region and a first source/drain region on a substrate;
a gate electrode overlapping the channel region on the substrate;
a first contact structure connected to the first source/drain region;
a plurality of first metal interconnections disposed on the first contact structure, extending in a first direction, parallel to an upper surface of the substrate, and spaced apart from each other;
a first via in contact with the first contact structure, wherein a same first surface of the first via is in contact with at least two of the plurality of first metal interconnections and wherein the first via is between the first contact structure and the plurality of first metal interconnections; and
a second via, wherein a same first surface of the second via is in contact with the at least two of the plurality of first metal interconnections on the plurality of first metal interconnections,
wherein the first via is a first single element and the second via is a second single element.

18. The semiconductor device of claim 17, wherein an upper surface of the first via includes a first portion in contact with a first line pattern of the plurality of first metal interconnections and a second portion in contact with a second line pattern of the plurality of first metal interconnections.

19. The semiconductor device of claim 18, wherein the first line pattern and the second line pattern are disposed to intersect the first via.

20. The semiconductor device of claim 17, wherein the first via has a shape in which a second length in a second direction, perpendicular to the first direction, is greater than a first length in the first direction.

21. The semiconductor device of claim 20, wherein the second via has a shape in which a fourth length in the second direction is greater than a third length in the first direction.

22. A semiconductor device, comprising:
a substrate having a semiconductor active region therein;
a gate electrode on the semiconductor active region;
a contact structure extending on and electrically connected to the semiconductor active region, on one side of the gate electrode;
a first via extending on and electrically connected to the contact structure, the first via having a shape in which a length in a second direction is greater than a length in a first direction, which is orthogonal to the second direction;
a plurality of spaced-apart first metal interconnections, which extend lengthwise in the first direction, and on the first via, wherein at least two of the plurality of spaced-apart first metal interconnections are electrically connected to and in contact with a same first surface of the first via; and
a second via, wherein a same first surface of the second via extends across, electrically connects to, and is in contact with the at least two of the plurality of spaced-apart first metal interconnections, and wherein the second via has a shape in which a length in the second direction is greater than a length in the first direction,
wherein the first via is a first single element and the second via is a second single element.

23. The semiconductor device of claim 22, wherein each of the first via and the second via intersects the plurality of spaced-apart first metal interconnections; and wherein the gate electrode extends lengthwise in the second direction.

24. The semiconductor device of claim 22, wherein the plurality of spaced-apart first metal interconnections include a pair of parallel first metal interconnections; and wherein the pair of parallel first metal interconnections are in contact with the first via.

25. The semiconductor device of claim 24, wherein the pair of parallel first metal interconnections extend over and cross the gate electrode at right angles.

26. The semiconductor device of claim 25, wherein the pair of parallel first metal interconnections contact opposing ends of an upper surface of the first via, as measured in the second direction.

* * * * *